United States Patent
Leung et al.

(10) Patent No.: US 8,258,852 B2
(45) Date of Patent: Sep. 4, 2012

(54) BOOTSTRAPPED HIGH-SIDE DRIVER CONTROL WITHOUT STATIC DC CURRENT FOR DRIVING A MOTOR BRIDGE CIRCUIT

(75) Inventors: Lap Chi David Leung, Hong Kong (HK); Yat Tung Lai, Hong Kong (HK); Chun Fai Wong, Hong Kong (HK); Kam Hung Chan, Kowloon (HK); Kwok Kuen David Kwong, Davis, CA (US)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 156 days.

(21) Appl. No.: 12/948,890

(22) Filed: Nov. 18, 2010

(65) Prior Publication Data

US 2012/0126736 A1 May 24, 2012

(51) Int. Cl.
*H03K 17/16* (2006.01)
(52) U.S. Cl. .......................... 327/390; 330/261; 323/316
(58) Field of Classification Search .................. 327/390, 327/148, 157; 330/251, 252, 264, 269, 292, 330/297, 310
See application file for complete search history.

(56) References Cited

U.S. PATENT DOCUMENTS

| | | | |
|---|---|---|---|
| 5,212,456 A * | 5/1993 | Kovalcik et al. | 330/261 |
| 5,397,967 A | 3/1995 | Carobolante et al. | |
| 5,796,276 A | 8/1998 | Phillips et al. | |
| 7,633,280 B2 * | 12/2009 | Ivanov et al. | 323/316 |

OTHER PUBLICATIONS

Marano, V. & Arrigo, D., "Novel Fully Integrated 65W Stepper Motor Driver IC", International Symposium on Power Electronics, Electrical Drivers, Automation and Motion, SPEEDAM 2006, S24-pp12-16, 2006.
Murari, Bertotti, Vignola, "Smart Power ICs, Technologies and Applications", 2nd ed., Springer, p. 232, 2002.

* cited by examiner

*Primary Examiner* — Lincoln Donovan
*Assistant Examiner* — Diana J Cheng
(74) *Attorney, Agent, or Firm* — Stuart T. Auvinen; g Patent LLC

(57) ABSTRACT

A motor driver circuit for driving the gate node of a high-side driver transistor to a boosted voltage from a charge pump draws little or no static current from the charge pump. The gate node is pulled to the boosted voltage by a p-channel pullup-control transistor that is driven by p-channel transistors that are pumped by capacitors that cut off current flow to ground from the charge pump. An n-channel output-shorting transistor shorts the gate node to the output when the high-side driver is turned off. A coupling capacitor initializes the shorting transistor for each output transition. A p-channel output-sensing transistor generates a feedback to a second stage that drives the coupling capacitor. P-channel diode transistors and an n-channel equalizing transistor control the voltage on the coupling capacitor.

20 Claims, 8 Drawing Sheets

BOOTSTRAPPED HIGH-SIDE DRIVER CONTROL WITHOUT STATIC DC CURRENT FOR DRIVING A MOTOR BRIDGE CIRCUIT

FIELD OF THE INVENTION

This invention relates to electric-motor driver circuits, and more particularly to high-side driver circuits using a boosted supply voltage.

BACKGROUND OF THE INVENTION

Certain applications require a driver transistor with a low-on resistance. An n-channel transistor with a large width or W/L ratio can be used to reduce on-resistance, which is especially useful when high drain currents are required by the application. Power management and power driver applications often require such a device.

Electric motors require high currents to energize magnets to turn a metal rotor. An alternating current (A.C.) is applied to the motor to quickly reverse the direction of magnet fields to propel the rotor as it turns. Full-bridge and half-bridge circuits are used to drive electric motors. These motor bridge circuits are an example of an application requiring low on-resistance.

An on-resistance of half an ohm or less is desirable. While this is easy to achieve for low-side n-channel drivers that drive the motor to ground, the high-side drivers that drive the motor to high voltages such as the power supply voltage are more problematic. A p-channel transistor could be used for the high-side driver, but the lower hole mobility causes the on-resistance to double or triple compared with an n-channel transistor with the better electron mobility.

When an n-channel transistor is used as the high-side driver, the gate voltage is often driven to a boosted voltage. The boosted voltage can be generated from the supply voltage using a charge pump. The boosted voltage is above the supply voltage. An oscillator can drive a capacitor between two diodes in the charge pump to generate the boosted voltage as is well known in the art.

Unfortunately, the charge pump supplies a dynamic current to maintain the boosted voltage. Also, there is a dynamic current drain from the boosted voltage node as gates such as the high-side driver transistor are charged and discharged. The predriver and other circuits that control the high-side driver transistor can also draw both static and dynamic current from the charge pump when they are powered by the boosted voltage rather than the supply voltage. A large charge-pump capacitor is required to supply the current. Thus the charge pump capacitor cannot be integrated on chip.

What is desired is a motor driver circuit that reduces current draw from the charge pump. A high-side driver circuit is desired with a reduced current draw and power consumption from the boosted supply. It is desired to reduce the charge pump capacitance is for integration on chip. A motor driver circuit that more efficiently uses a bootstrapped supply is desirable. An integrated motor driver circuit is desired.

DETAILED DESCRIPTION

The present invention relates to an improvement in motor driver circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
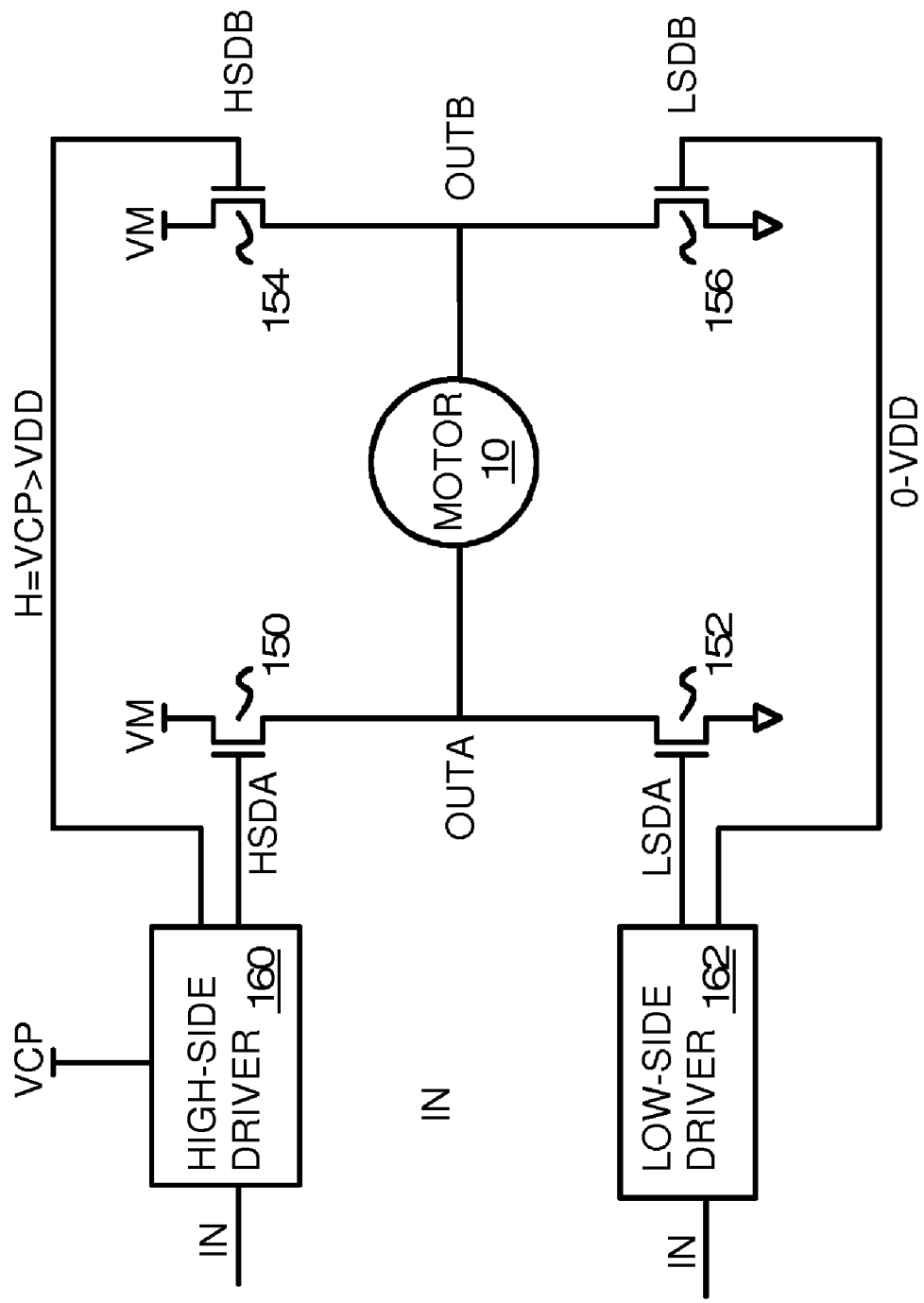
FIG. 1 is a block diagram of a motor driver circuit.

FIG. 1 is a block diagram of a motor driver circuit. Motor 10 is an electric motor with magnets and coil windings that are energized with an alternating current to cause a rotor to spin, or to cause other physical movement. Nodes OUTA and OUTB connect to the terminals of motor 10 and carry the alternating current.

The alternating current is created by rapidly switching transistors 150, 152, 154, 156 on and off. During a first phase, high-side driver transistor 150 and low-side driver transistor 156 are both turned on while high-side driver transistor 154 and low-side driver transistor 152 are turned off, thus driving OUTA to motor power supply VM and driving OUTB to ground. Then during a second phase, high-side driver transistor 150 and low-side driver transistor 156 are both turned off while high-side driver transistor 154 and low-side driver transistor 152 are turned on, thus driving OUTB to the motor power supply VM and driving OUTA to ground. These two phase are repeated in rapid succession to provide the alternating current to turn the rotor in motor 10.

Figure 4:
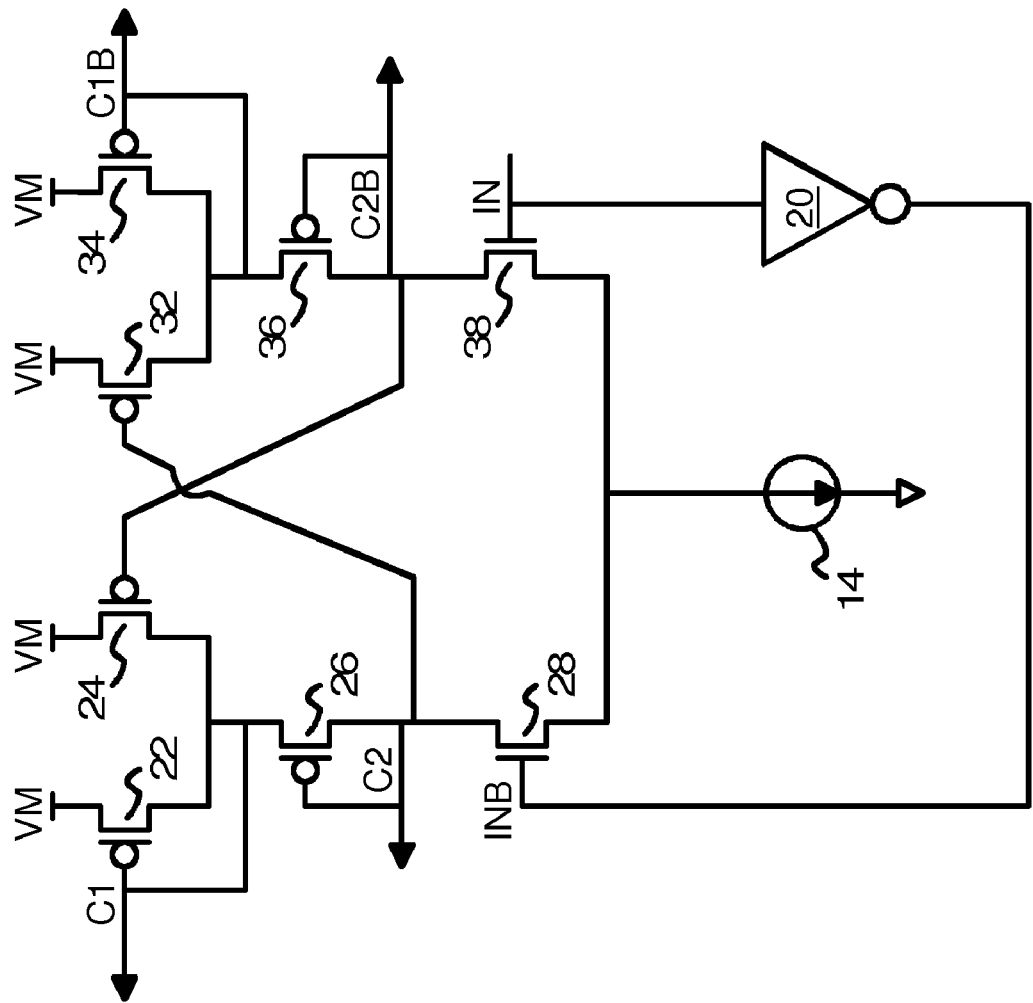
FIG. 4 is a schematic of a first stage of the high-side driver circuit.
Figure 5:
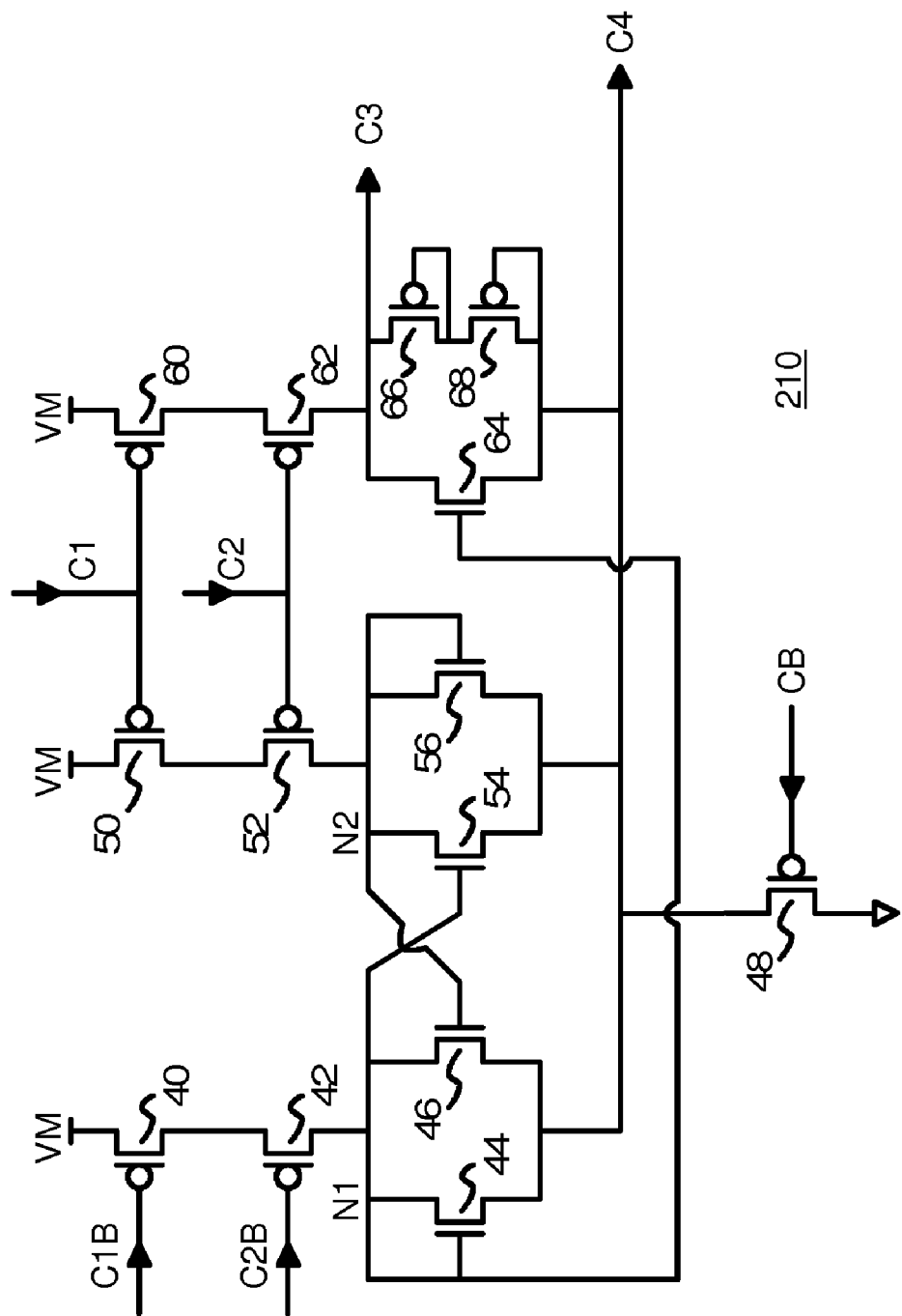
FIG. 5 shows a second stage of the high-side driver circuit.
Figure 6:
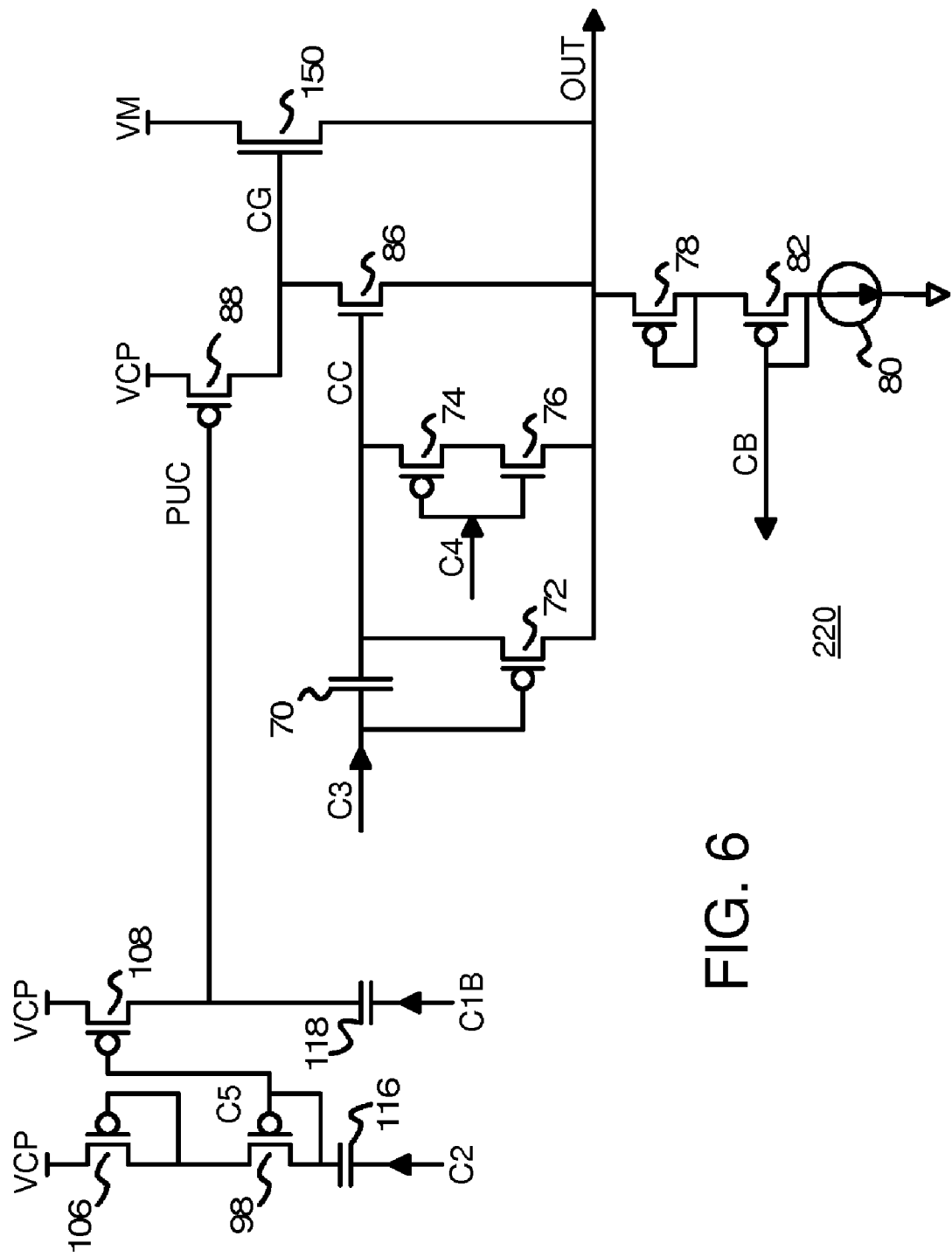
FIG. 6 shows the third stage of the high-side driver circuit.

Low-side driver circuit 162 can be a conventional circuit that drives signal LSDA to the gate of low-side driver transistor 152 and drives signal LSDB to the gate of low-side driver transistor 156. High-side driver circuit 160 is a special circuit that drives signal HSDA to the gate of high-side driver transistor 150 and drives signal HSDB to the gate of high-side driver transistor 154. The circuit shown in FIGS. 4-6 can be used to drive HSDA, while another circuit such as shown in FIGS. 4-6 can be used to drive HSDB.

While low-side driver circuit 162 drives LSDA and LSDB between ground and a power supply VDD, high-side driver circuit 160 drives HSDA and HSDB to a high voltage that is a boosted voltage VCP that is above VDD. A charge-pump voltage VCP is applied to high-side driver circuit 160. Rather than drive the gates of high-side driver transistors 150, 154 to ground, high-side driver circuit 160 can short their gates to OUTA, OUTB, respectively, to turn off high-side driver transistors 150, 154.

Figure 2:
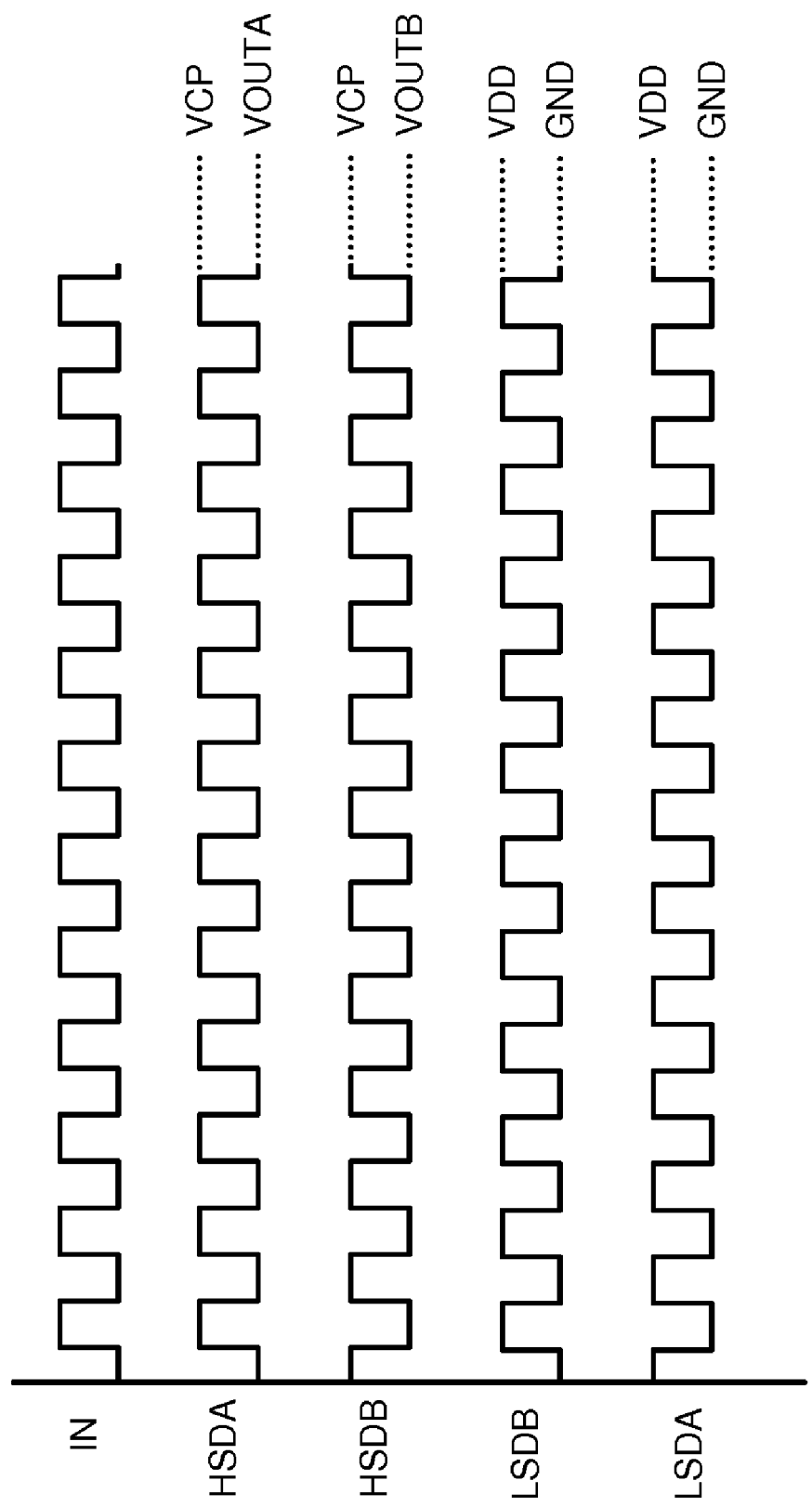
FIG. 2 is a waveform diagram of control signals for the motor circuit of FIG. 1.

FIG. 2 is a waveform diagram of control signals for the motor circuit of FIG. 1. An input signal has a period that is chosen for a desired speed of the rotor in motor 10 of FIG. 1. This input signal IN can switch between VDD and ground, and is applied to high-side driver circuit 160 and low-side driver circuit 162. Some signal shaping such as delays, filters, or logic blocks can be added to the separate IN inputs to high-side driver circuit 160 and to low-side driver circuit 162 to adjust IN to each circuit to prevent overlapping of HSDA and LSDA, and of HSDB with LSDB. Overlapping of HSDA with LSDA is undesirable since a large current could pass through transistors 150, 152 from VM to ground if both were on at the same instant of time.

High-side driver circuit 160 drives HSDA high and HSDB low when IN is high, but drives HSDA low and HSDB high when IN is low. The high voltage is the boosted voltage from the charge pump, VCP, or a derivative. The low voltage applied to the gates of transistors 150, 154 is actually a gate-to-source short, so that OUTA is applied to the gate (HSDA) of transistor 150, and OUTB is applied to the gate (HSDB) of transistor 154 instead of a fixed low voltage. Shorting the gate and source turns off the n-channel transistors. As the OUTA, OUTB signals are driven low by transistors 152, 156, OUTA, OUTB decrease from the previously high voltage toward ground.

Low-side driver circuit 162 drives LSDA high and LSDB low when IN is low, but drives LSDA low and LSDB high when IN is high. LSDA, LSDB are driven between ground and VDD.

Figure 3:
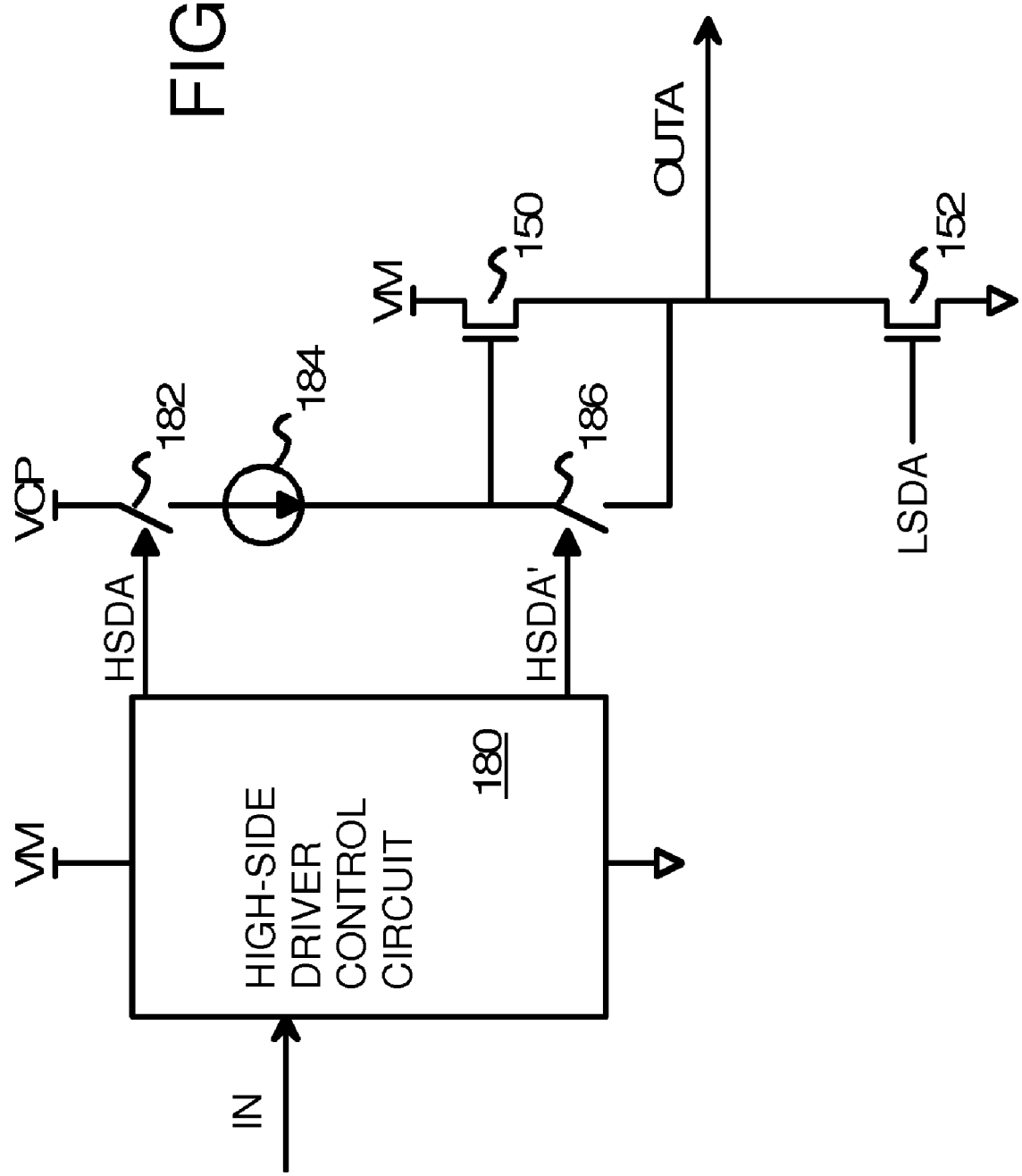
FIG. 3 highlights the high-side driver circuit driving the high-side driver transistor using a charge-pump voltage.

FIG. 3 highlights the high-side driver circuit driving the high-side driver transistor using a charge-pump voltage. OUTA to motor 10 (FIG. 1) is driven low by n-channel low-side driver transistor 152 when LSDA is high. High-side driver transistor 150 drives OUTA to motor supply VM when HSDA is high.

When HSDA is high, switch 182 closes and switch 186 opens, allowing current source 184 to drive current from boosted voltage VCP to the gate of high-side driver transistor 150. When HSDA is low, switch 182 open and switch 186 closes, shorting the gate and source of high-side driver transistor 150.

Rather than apply boosted voltage VCP to high-side driver circuit 180, the motor supply VM is applied as the power supply to high-side driver transistor 180. Thus the charge pump is not providing supply current to high-side driver circuit 180. Static and dynamic current draw from the charge pump is significantly reduced. The charge pump only supplies current to charge the gate of high-side driver transistor 150, and for control switch 182.

High-side driver circuit 160 of FIG. 1 includes two sets of high-side driver circuit 180, switches 182, 186, and current source 184. FIG. 3 is a conceptual diagram intended to show principles of operation rather than actual components.

FIG. 4 is a schematic of a first stage of the high-side driver circuit. An input signal IN is high when the high-side driver transistor should be turned on, and low when the high-side driver transistor is to be turned off. The purpose of first stage 200 is to generate control signals C1, C2 and their complements C1B, C2B that are applied to later stages. First stage 200 uses the motor supply voltage VM so that power is not drawn from the charge pump, which could occur if boosted voltage VCP were used for the first-stage power supply rather than VM in a conventional approach.

When IN is high, inverter 20 drives a low onto the gate of n-channel differential transistor 28, turning it off and blocking current flow through p-channel transistors 22, 24, 26 to current sink 14.

The high IN on the gate of n-channel differential transistor 38 turns it on, allowing current to flow through p-channel transistors 32, 34, 36 to current sink 14. P-channel transistor 34 has its gate and drain connected together, so as current flows through this saturated device, the gate and drain voltage C1B is a gate-to-source voltage (VGS) below Vm, or VM–VGS.

Likewise, p-channel transistor 36 has its gate and drain connected together, so as current flows, its gate and drain voltage C2B is at least one more VGS below C1B, or VM–2VGS. Note that thresholds increase due to the body effect, and the transistor can have a gate-to-source voltage that is more than the threshold voltage, and the p-channel and n-channel thresholds often differ, and VGS can vary for different transistors and different operating conditions, so the use of VGS is a rough approximation that is useful for understanding the operation of the circuit. As used herein, VGS is not meant to be an exact number but as an aide to understanding.

The lower voltage on C2B (VM–2VGS) is applied to the gate of p-channel transistor 24, turning it on and pulling node C1 up to VM on the left side. Since n-channel differential transistor 28 is off, node C2 can also be pulled high to VM. Thus when IN=1, C1=C2=VM, C1B=VM–VGS and C2B=VM–2VGS.

When IN is low, n-channel differential transistor 28 turns on and n-channel differential transistor 38 turns off, stopping current flow through p-channel transistors 32, 34, 36. C1B and C2B are pulled up to VM by p-channel transistor 32. Current flowing through p-channel transistors 22, 26 with their gates and drains tied together in a diode arrangement produce two voltage drops of VGS, so that when IN=0, C1B=C2B=VM, C1=VM–VGS and C2=VM–2VGS.

Thus C1 and C1B swing between a high of VM and a low of VM–VGS. C2 and C2B swing between a high of VM and a low of VM–2VGS. C1 and C2 follow IN while C1B, C2B are inverted relative to IN.

FIG. 5 shows a second stage of the high-side driver circuit. Second stage 210 receives control signals C1, C2, C1B, C2B that are generated by first stage 200 of FIG. 4. Second stage 210 generates signals C3, C4 to the third stage, and receives signal CB from the third stage.

The first series devices, p-channel transistor 40, which receives C1B on its gate, and p-channel transistor 42, which receives C2B on its gate, turn on and drives a high to node N1 when IN is high. The high on N1 can be one VGS above C4, and is applied to the gates of n-channel transistors 44, 54, 64 and turns them on. N-channel transistor 64 then connects C3 and C4 together.

The second series devices, p-channel transistor 50, which receives C1 on its gate, and p-channel transistor 52, which receives C2 on its gate, turn on when IN is low. Then node N2 is driven higher by p-channel transistors 50, 52. The high on N2 is applied to the gates of n-channel transistors 46, 56 and turns them on.

Likewise, the third series devices, p-channel transistor 60, which receives C1 on its gate, and p-channel transistor 62, which receives C2 on its gate, also turn on when IN is low. Transistor 64 is turned off when IN is low. Then node C3 is driven higher to 2 VGS above C4 by p-channel transistors 60, 62.

P-channel diode-connected transistors 66, 68 are also turned on when transistors 60, 62 turn on. Then p-channel diode transistors 66, 68 maintain C3 at about 2VGS above C4. C4 is maintained at about VGS above CB.

FIG. 6 shows the third stage of the high-side driver circuit. Third stage 220 receives control signals C2, C1B from first stage 200 (FIG. 4) and signals C3, C4 from second stage 210 (FIG. 5).

Signal CB is generated by the gate and drain connection of p-channel generating transistor 82, and signal CB is sent to second stage 210. As the output OUT applied to the motor falls from high (VM) to ground, signal CB also falls. P-channel output-sensing transistor 78 has its gate and drain connected together. Current sink 80 sinks current from the drain of p-channel generating transistor 82. Transistors 78, 82 maintain signal CB at about 2VGS below OUT.

High-side driver transistor 150 is a large transistor that drives current to the motor from supply VM. The motor is connected to node OUT. The gate of high-side driver transistor 150 is node CG, and is driven high with the boosted voltage VCP from the charge pump through p-channel pullup-control transistor 88 when IN is high. Node CG is shorted to the output OUT by n-channel output-shorting transistor 86, thus turning off high-side driver transistor 150 when IN is low.

The pullup-control signal PUC is driven between VCP and about a VGS below VCP to turn p-channel pullup-control transistor 88 off and on, respectively. Control signals C2 and C1B pulse in opposite directions. When IN is high, C2 is high (VM) and C1B is low (VM−VGS). When IN is low, C2 is low (VM−2VGS) and C1B is high (VM).

Capacitor 116 couples the change of 2VGS on C2 through to node C5. When C2 drops from VM to VM−2VGS, node C5 is pulled low (VCP-2VGS), and p-channel diode transistors 106, 98 turn on. The lower voltage on C5 is applied to the gate of p-channel transistor 108, turning it on and driving VCP onto PUC. At the same time, C1B rises to VM. The higher PUC turns off p-channel pullup-control transistor 88. A voltage of VCP-VM is stored across capacitor 118.

When C2 rises from VM−2VGS to VM, node C5 is pushed high to VCP, and p-channel diode transistors 106, 98 turn off. The higher voltage on C5 is applied to the gate of p-channel transistor 108, turning it off. At the same time, C1B falls from VM to VM−VGS, coupling through capacitor 118 a lower voltage (VCP-VGS=VM−VGS+VCP-VM) onto PUC. The lower PUC turns on p-channel pullup-control transistor 88, driving CG to boosted voltage VCP and turning high-side driver transistor 150 on strongly.

N-channel output-shorting transistor 86 turns on when IN is low. The gate of n-channel output-shorting transistor 86 is node CC, which is the back side of coupling capacitor 70. The front side of 'coupling capacitor 70 is node C3 from second stage 210 (FIG. 5). When OUT is driven close to 0V, CC is about 2VGS as transistors 74 and 76 are on and C3 is about 3VGS as transistors 48, 66, and 68 are on. A voltage of +VGS is stored in capacitor 70. This ensures that n-channel output-shorting transistor 86 is turned off before the beginning of the next cycle when IN goes from low to high.

Node C4 from second stage 210 is applied to the gates of p-channel initializing transistor 74 and n-channel initializing transistor 76. At the beginning of a new cycle, when IN is 0 and switching to 1, OUT is near ground and n-channel output-shorting transistor 86 is still on. Both p-channel initializing transistor 74 and n-channel initializing transistor 76 turn on simultaneously. During the transition of IN from 0 to 1, C3 is changed to VGS from 3VGS as transistor 64 is turned on, thus CC is also dropped by 2VGS through coupling capacitor 70 to approximately 0V and turns off transistor 86.

When IN=1, OUT is near VM, C4=VM−VGS and C3=C4 as transistor 64 is turned on. CC=VM as shorting capacitor-output shorting transistor 72 is turned on. Thus, −VGS is stored in capacitor 70. As IN changes from 0 to 1, C4 remains at OUT-VGS and C3 is pulled to VM momentarily. The change in voltage at C3 is VGS, therefore CC is pulled up to VM+VGS by coupling capacitor 70. As a result, it turns on transistor 86 to turn off transistor 150.

Node C4 is driven to OUT-VGS by mirroring from p-channel generating transistor 82 to p-channel sink transistor 48 by node CB. The sources of both p-channel transistors 82, 48 are about OUT-VGS due to the voltage drop through p-channel output-sensing transistor 78. Once OUT falls below 2VGS, node CB is no longer maintained at OUT-2VGS. For example, when OUT is close to 0V, CB can only go down to 0V and both transistors 78 and 82 are off. Since CB is close to 0V, C4 is about VGS above CB.

The only transistors driven by the charge pump (using VCP) are p-channel transistors 106, 108 and p-channel pullup-control transistor 88. Current flow through p-channel transistors 106, 108 to ground is blocked by capacitors 116, 118, so these is no static current taken from the charge pump, only charging currents for capacitors 116, 118 and parasitic capacitances. Thus current draw from the charge pump is minimized.

Figure 7:
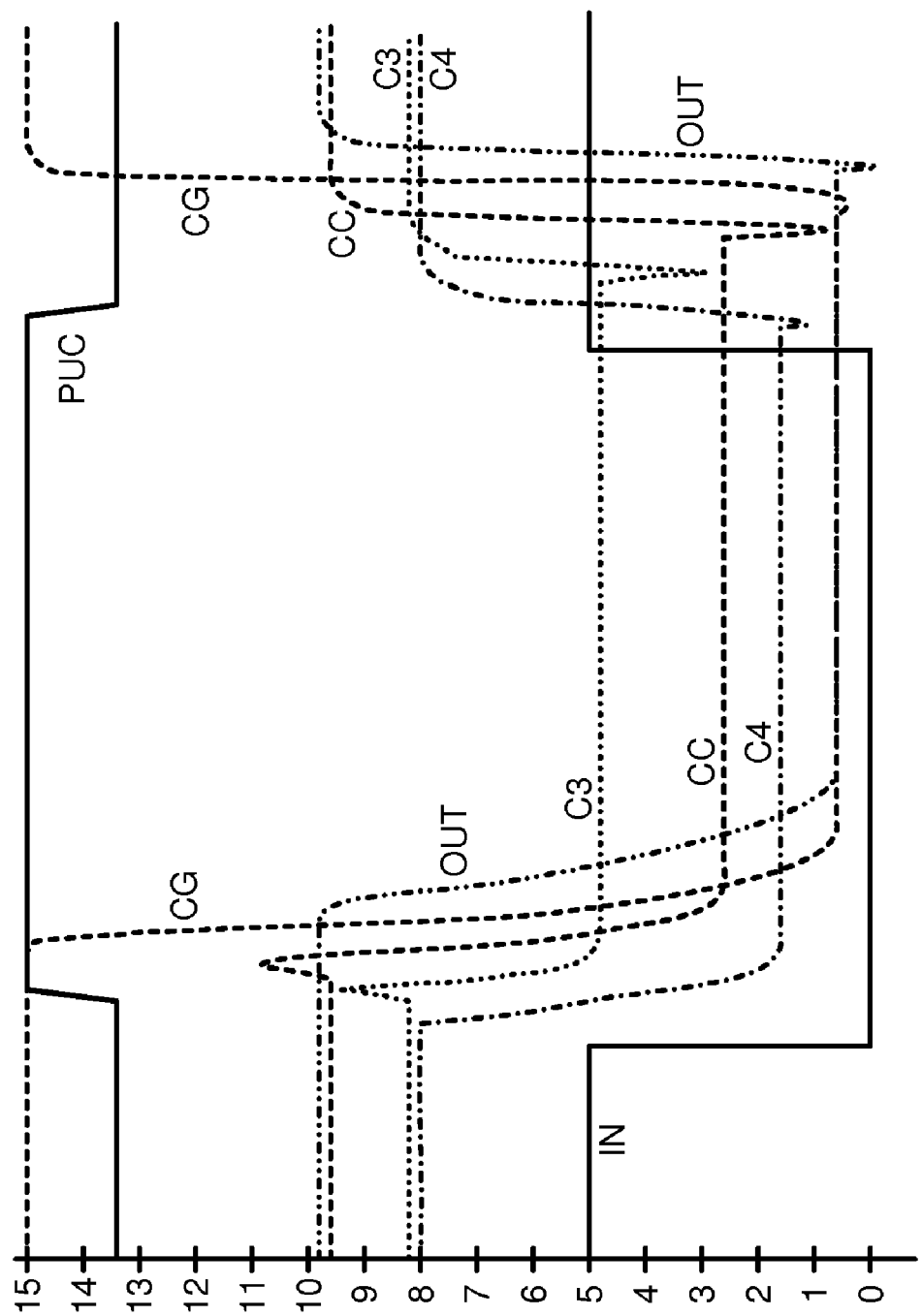
FIG. 7 is a waveforms diagram of operation of the high-side driver transistor circuit of FIGS. 4-6.

FIG. 7 is a waveforms diagram of operation of the high-side driver transistor circuit of FIGS. 4-6. When IN transitions low, high-side driver transistor 150 turns off and OUT falls as the low-side driver sinks motor current. PUC goes high to turn off p-channel pullup-control transistor 88, floating gate node CG. Gate node CG, the gate of high-side driver transistor 150, is driven low by n-channel output-shorting transistor 86, which has node CC as its gate. Node CC initially pulses high and then falls from about 10 volts to 3 volts, which is enough to keep n-channel output-shorting transistor 86 turned on.

Node C3 falls from 8 volts to 5 volts, and node C4 falls from 8 volts to 2 volts. Voltages are approximate. Capacitor node CC swings between 10 and 3 volts.

When IN transitions high, PUC goes low to turn on p-channel pullup-control transistor 88, driving gate node CG of high-side driver transistor 150 to the boosted voltage of about 15 volts. N-channel output-shorting transistor 86 turns off as node CC initially dips lower to ground, then rises to 10 volts. Node C3 dips then rises to 8 volts, and node C4 rises from 2 volts to 8 volts. High-side driver transistor 150 turns on and OUT rises from ground to 10 volts. VM is 10 volts in this example.

Figure 8:
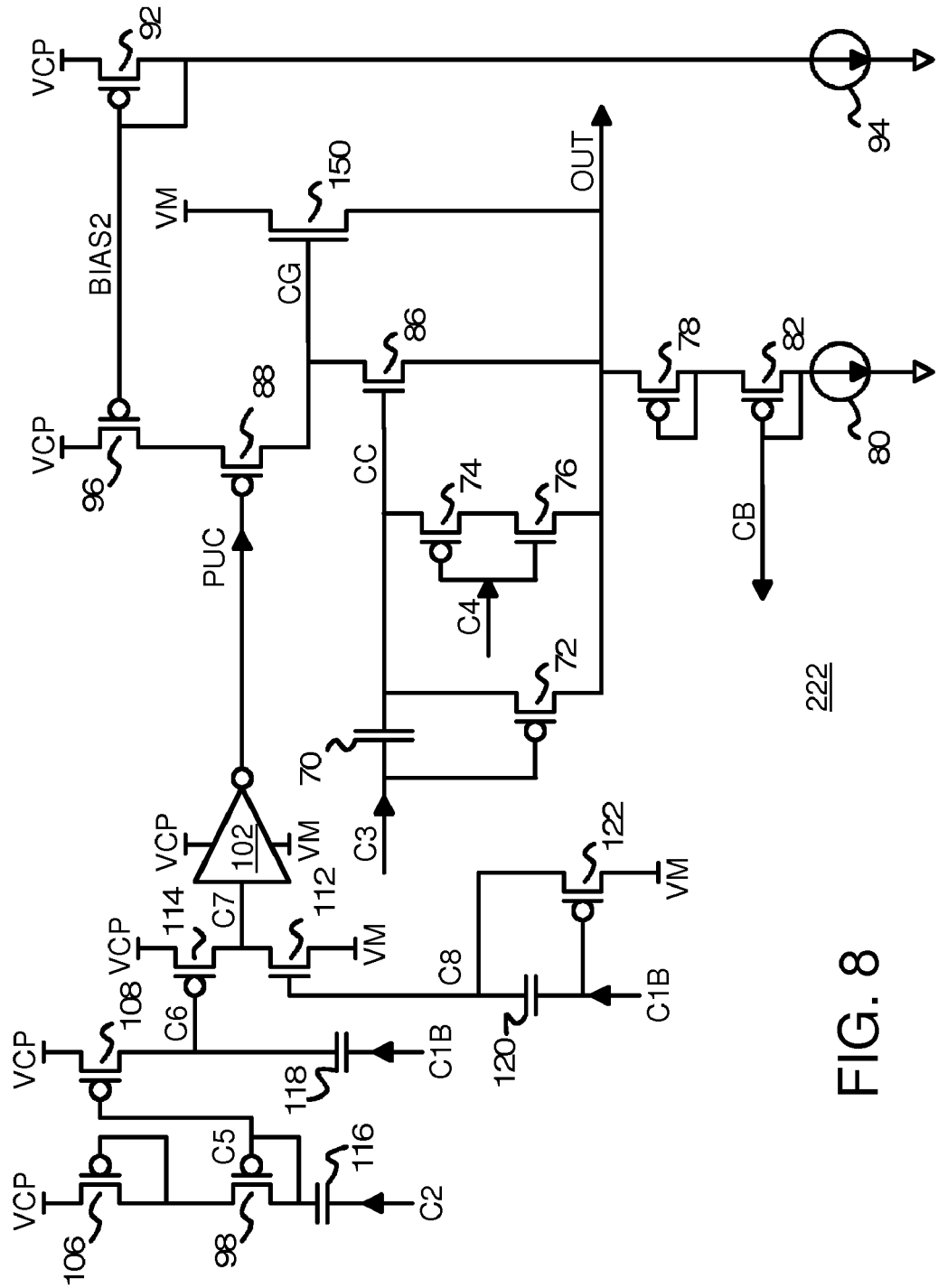
FIG. 8 is an alternate embodiment of the third stage of the high-side driver circuit.

FIG. 8 is an alternate embodiment of the third stage of the high-side driver circuit. In this alternative, the pullup control circuit that generates PUC is configured as a switch. A small static bias current of about 1 µA is drawn from the charge pump in this alternative.

Signals C2 and C1B pump on capacitors 116, 118 to cause p-channel transistors 98, 106, 108 to drive node C6 as they did for node PUC in FIG. 6. However, an additional switch is inserted between node C6 and PUC in this alternative of third stage 210 (FIG. 6), third stage 222.

Node PUC swings between VM and VCP in this embodiment. Thus inverter 102 uses VCP as the power supply and VM as the lower (ground) supply.

P-channel transistor 114 acts as a pull-up transistor with its source connected to VCP and drain connected to node C7, the input to inverter 102. The gate of p-channel transistor 114 is node C6, which corresponds to PUC in FIG. 6. C1B also pumps on capacitor 120 to drive the gate of n-channel transistor 112, which has its drain connected to the drain of p-channel transistor 114 as node C7. The source of n-channel transistor 112 is motor supply VM. The back side of capacitor 120 is node C8. P-channel transistor 122 has its gate driven by C1B and connects node C8 to supply VM.

When IN=1, C2 and C1B are at VM and VM−VGS respectively. Node C6 is at VCP-VGS, thus it turns on transistor 114 and C7=VCP, PUC=VM, and charges up CG to VCP to turn on transistor 150. Transistor 122 is also turned on, C8=VM and +VGS is stored in capacitor 120. When IN=0, C6=VCP, transistor 114 is off, C8 is about VM+VGS to turn on transistor 112. Then C7 is pulled to VM and PUC is pulled up to VCP, thus turning off transistor 88.

A bias voltage VBIAS2 is generated by the gate and drain connection of p-channel bias transistor 92, which connects to VCP at its source. Current sink 94 draws a small current through p-channel bias transistor 92. BIAS2 is applied to the gate of p-channel transistor 96, winch is inserted between the source of p-channel pullup-control transistor 88 and VCP. Transistor 96 acts as a current source and transistor 88 acts as a switch which is being turned on hard. Once CG is charged up to VCP, no current is drawn from VCP via transistor 96 and only small DC current is consumed by current source 94.

Alternative Embodiments

Several other embodiments are contemplated by the inventors. Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Transistors 42, 52, and 62 in FIG. 5 can be removed in some embodiments.

Inversions may be added, or extra buffering. The final sizes of transistors and capacitors may be selected after circuit simulation or field testing. Metal-mask options or other programmable components may be used to select the final capacitor, resistor, or transistor sizes.

P-channel rather than n-channel transistors (or vice-versa) may be used for some technologies or processes, and inversions, buffers, capacitors, resistors, gates, or other components may be added to some nodes for various purposes and to tweak the design. The first stage and the second stage could be implemented in a variety of circuit arrangements. PMOS transistors 66 and 68 in FIG. 5 can be replaced by NMOS transistors.

Timings may be adjusted by adding delay lines or by controlling delays in leading-edge blocking units. Pulse generators could also be added. The outputs of first stage 200 may be swapped to add an inversion. Inverting and non-inverting inputs to comparators may be swapped and the polarity of the output reversed.

Separate power supplies and grounds may be used for some components. The charge pump may be a standard charge pump with diodes and capacitors, or may be any of the many more complex charge pump designs. Various filters could be added. Active low rather than active high signals may be substituted.

While positive currents have been described, currents may be negative or positive, as electrons or holes may be considered the carrier in some cases. Source and sink currents may be interchangeable terms when referring to carriers of opposite polarity. Currents may flow in the reverse direction.

Current sources or current sinks may be p-channel or n-channel transistors with gates connected to a fixed bias voltage. The fixed bias voltage may be switched to power or ground to power down the circuit.

The circuit designer may choose resistors, capacitors, transistors, and other components to have a ratio that produces the desired reference voltages. While Complementary-Metal-Oxide-Semiconductor (CMOS) and LDMOS transistors have been described, other transistor technologies and variations may be substituted, and materials other than silicon may be used, such as Galium-Arsinide (GaAs) and other variations. DMOS, LDMOS, and diffusion-enhanced transistors may be used. Rather than drive a motor, the circuit may drive an actuator, a LED, or other devices.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A high-side driver circuit comprising:
a supply node having a supply voltage;
a charge pump node having a charge pump voltage, wherein the charge pump voltage is higher than the supply voltage;
a first stage receiving a pulsing input and generating a first high pulse on a first high pulse node and a second high pulse on a second high pulse node, the first high pulse pulsing between the supply voltage and a first voltage less than the supply voltage, the second high pulse pulsing between the supply voltage and a second voltage less than the supply voltage and less than the first voltage;
a second stage receiving the first high pulse and the second high pulse, for generating a third pulsing node and a fourth pulsing node;
wherein the first stage and the second stage are powered by the supply voltage and are not connected to the charge pump node;
a high-side driver transistor controlled by a gate node and driving current from the supply node to an output;
a pullup-control transistor receiving a pull-up-control node that controls current flow from the charge pump node to the gate node;
an output-shorting transistor controlled by a coupling node, for connecting the gate node to the output when the high-side driver transistor is turned off;
a coupling capacitor coupled between the third pulsing node and the coupling node;
an output-sensing transistor coupled to the output and generating a sense current;

a generating transistor receiving the sense current and generating a feedback signal to the second stage;

a sink transistor that receives the feedback signal on a gate and is coupled to sink current from the fourth pulsing node in response to the feedback signal;

an equalizing transistor for connecting the third pulsing node to the fourth pulsing node when the second stage senses the first high pulse near the supply voltage; and a capacitor-output shorting transistor for connecting the coupling node to the output in response to a gate connected to the third pulsing node.

2. The high-side driver circuit of claim 1 further comprising:

a p-channel initializing transistor and an n-channel initializing transistor having channels in series between the coupling node and the output node, and having gates connected to the fourth pulsing node, for initializing the coupling node to the output before the output transitions from low to high, whereby the coupling node of the coupling capacitor is initialized for each high-going transition of the output.

3. The high-side driver circuit of claim 2 further comprising:

a first diode transistor having a gate and a drain connected together and to a diode intermediate node, and having a source connected to the third pulsing node;

a second diode transistor having a gate and a drain connected together and to the fourth pulsing node, and having a source connected to the diode intermediate node.

4. The high-side driver circuit of claim 3 further comprising:

a first series upper transistor having a gate receiving the first high pulse from the first stage, for conducting current from the supply node to a first series node;

a first series lower transistor having a gate receiving the second high pulse from the first stage, for conducting current from the first series node to the third pulsing node.

5. The high-side driver circuit of claim 4 wherein the sink transistor is a p-channel transistor having a drain connected to a ground and a source connected to the fourth pulsing node, and a gate receiving the feedback signal;

wherein the output-sensing transistor is a p-channel transistor;

wherein the generating transistor is a p-channel transistor having a source receiving the sense current and having a gate and a drain connected together to generating the feedback signal to the second stage.

6. The high-side driver circuit of claim 5 wherein the capacitor-output shorting transistor, and the pullup-control transistor are p-channel transistors;

wherein the equalizing transistor is an n-channel transistor.

7. The high-side driver circuit of claim 1 further comprising:

a pull-up-control circuit for generating a pull-up-control signal on the pull-up-control node to the pullup-control transistor, the pull-up control circuit comprising:

a first capacitor coupled between the pull-up-control node and a complement of the first high pulse generated by the first stage;

a first driving transistor for driving current from the charge pump node to the pull-up-control node in response to a driving gate node;

a second capacitor coupled between the driving gate node and the second high pulse generated by the first stage;

a first diode transistor having a gate and a drain connected to an intermediate node and a source connected to the charge pump node; and a second diode transistor having a gate and a drain connected to the driving gate node and a source connected to the intermediate node.

8. The high-side driver circuit of claim 1 further comprising:

a buffered pull-up-control circuit for generating a pull-up-control signal on the pull-up-control node to the pullup-control transistor, the buffered pull-up control circuit comprising:

a first capacitor coupled between a first buffer node and a complement of the first high pulse generated by the first stage;

a first driving transistor for driving current from the charge pump node to the first buffer node in response to a driving gate node;

a second capacitor coupled between the driving gate node and the second high pulse generated by the first stage;

a first diode transistor having a gate and a drain connected to an intermediate node and a source connected to the charge pump node;

a second diode transistor having a gate and a drain connected to the driving gate node and a source connected to the intermediate node;

a first buffer transistor having a source connected to the charge pump node, a gate connected to the first buffer node, and a drain connected to a second buffer node;

a first buffer pump transistor having a source connected to the supply node, a gate connected to a buffer gate node, and a drain connected to the second buffer node;

a third capacitor coupled between the buffer gate node and the complement of the first high pulse generated by the first stage;

a buffer bypass transistor having a gate receiving the complement of the first high pulse, for connecting the supply node to the buffer gate node;

wherein the second buffer node is a complement of the pull-up-control node, or the second buffer node drives high inverters that drive the pull-up-control node, wherein the high inverter is powered by the charge pump node and use the supply node as an inverter ground.

9. The high-side driver circuit of claim 1 wherein the second stage comprises:

a complement series upper transistor having a gate receiving a complement of the first high pulse from the first stage, for conducting current from the supply node to a first complement series node;

a complement series lower transistor having a gate receiving a complement of the second high pulse from the first stage, for conducting current from the first complement series node to a second complement series node;

a complement parallel n-channel transistor having a gate receiving the second complement series node, for conducting current from the second complement series node to the fourth pulsing node;

a complement cross-over parallel n-channel transistor having a gate receiving a second true series node, for conducting current from the second complement series node to the fourth pulsing node;

a true series upper transistor having a gate receiving the first high pulse from the first stage, for conducting current from the supply node to a first true series node;

a true series lower transistor having a gate receiving the second high pulse from the first stage, for conducting current from the first true series node to a second true series node;

a true parallel n-channel transistor having a gate receiving the second true series node, for conducting current from the second true series node to the fourth pulsing node; and a true cross-over parallel n-channel transistor having a gate receiving the second complement series node, for conducting current from the second true series node to the fourth pulsing node.

10. The high-side driver circuit of claim 9 wherein the first stage comprises:

a true differential n-channel transistor having a gate receiving an inverse of the pulsing input, a drain connected to the second high pulse node, and a source connected to a tail node;

a true lower diode p-channel transistor having a gate and a drain connected to the second high pulse node, and a source connected to the first high pulse node;

a true upper diode p-channel transistor having a gate and a drain connected to a first high pulse node carrying the first high pulse, and a source connected to the supply node;

a true crossover p-channel transistor having a gate connected to a second complement node that carries a complement of the second high pulse, a drain connected to a first high pulse node, and a source connected to the supply node;

a complement differential n-channel transistor having a gate receiving the pulsing input, a drain connected to the second complement node, and a source connected to the tail node;

a complement lower diode p-channel transistor having a gate and a drain connected to the second complement node, and a source connected to a first complement node that carries a complement of the first high pulse;

a complement upper diode p-channel transistor having a gate and a drain connected to the second complement node, and a source connected to the supply node;

a complement crossover p-channel transistor having a gate connected to the second high pulse node, a drain connected to the second complement node, and a source connected to the supply node.

11. The high-side driver circuit of claim 1 wherein the output is connected to power an electric motor;

wherein the supply node is a motor supply node of at least 10 volts.

12. The high-side driver circuit of claim 1 wherein the high-side driver circuit is integrated onto a single monolithic substrate.

13. A driver Integrated Circuit (IC) comprising on a single substrate:

high-side driver transistor means for driving a large current between a supply and an output in response to a gate node;

pullup-control transistor means for conducting current between a charge pump node and the gate node in response to a pull-up-control node on a gate;

output-shorting transistor means for conducting current between the gate node and the output in response to a compensating node;

coupling capacitor means for capacitively coupling a third node to the compensating node;

capacitor-output shorting transistor means for conducting current between the compensating node and the output in response to the third node;

p-channel initializing transistor means for conducting current between the compensating node and an intermediate initializing node in response to a fourth node;

n-channel initializing transistor means for conducting current between the intermediate initializing node and the output in response to the fourth node;

output-sensing transistor means for conducting current between the output and an intermediate sensing node;

feedback generating transistor means for conducting current between the intermediate sensing node and a feedback node, the feedback generating transistor means having a gate connected to the feedback node;

first stage means for generating pulses on a first pulse node, on a second pulse node, on a first complement pulse node, and on a second complement pulse node in response to an input that is pulsing;

second stage means, receiving the first pulse node, the second pulse node, the first complement pulse node, and the second complement pulse node from the first stage means, for generating signals on the third node and on the fourth node; and p-channel sink transistor means for conducting current between the fourth node and a ground in response to the feedback node.

14. The driver IC of claim 13 further comprising:

n-channel equalizing transistor means for conducting current between the third node and the fourth node in response to a true intermediate signal generated by the second stage means.

15. The driver IC of claim 14 further comprising:

first p-channel diode transistor means for conducting current from the third node to a diode intermediate node; and second p-channel diode transistor means for conducting current from the diode intermediate node to the fourth node.

16. The driver IC of claim 13 further comprising:

pull-up-control means for generating a pull-up-control signal on the pull-up-control node, the pull-up-control node means comprising:

first capacitor means for pumping the pull-up-control node using pulses on the first complement pulse node;

first p-channel charge-pump transistor means for conducting current from the charge pump node to the pull-up-control node in response to a fifth node;

first p-channel charge-pump diode transistor means for conducting current from the charge pump node to a sixth node in response to the sixth node;

second p-channel charge-pump transistor means for conducting current from the sixth node to the fifth node in response to the fifth node; and second capacitor means for pumping the fifth node using pulses on the second pulse node.

17. A high-side driver comprising:

a high-side driver transistor having a conducting channel between a supply and an output and a gate connected to a gate node;

a p-channel pullup-control transistor having a conducting channel between a boosted supply and the gate node a gate connected to a pull-up-control node;

wherein the boosted supply has a voltage higher than a supply voltage of the supply;

an n-channel output-shorting transistor having a conducting channel between the gate node and the output and a gate connected to a coupling node;

a coupling capacitor between the coupling node and a third node;

a p-channel capacitor-output shorting transistor having a conducting channel between the coupling node and the output and a gate connected to the third node;

a p-channel initializing transistor having a conducting channel between the coupling node and an intermediate initializing node and a gate connected to a fourth node;

an n-channel initializing transistor having a conducting channel between the intermediate initializing node and the output and a gate connected to the fourth node;

a p-channel output-sensing transistor having a conducting channel between the output and an intermediate sensing node and a gate connected to the intermediate sensing node;

a p-channel generating transistor having a conducting channel between the intermediate sensing node and a feedback node and a gate connected to the feedback node;

a p-channel sink transistor having a conducting channel between the fourth node and a ground and a gate connected to the feedback node;

a first stage that receives an input and generates pulses on a first pulse node, on a second pulse node, on a first complement pulse node, and on a second complement pulse node in response to the input that is pulsing; and a second stage receiving the first pulse node, the second pulse node, the first complement pulse node, and the second complement pulse node from the first stage, and generates signals on the third node and on the fourth node, whereby current is drawn from the supply rather than from the boosted supply for the first stage and for the second stage.

18. The high-side driver of claim 17 further comprising:

a n-channel equalizing transistor having a conducting channel between the third node and the fourth node and a gate connected to a complement second node in the second stage;

a first p-channel diode transistor having a conducting channel between the third node and an intermediate diode node and a gate connected to the intermediate diode node;

a second p-channel diode transistor having a conducting channel between the intermediate diode node and the fourth node and a gate connected to the fourth node;

a first p-channel source transistor having a conducting channel between the supply and an intermediate source node and a gate connected to the first complement pulse node from the first stage; and a second p-channel source transistor having a conducting channel between the intermediate source node and the third node and a gate connected to the second complement pulse node from the first stage.

19. The high-side driver of claim 18 further comprising:

a first capacitor coupled between the pull-up-control node and the first complement pulse node;

a first p-channel charge-pump transistor having a conducting channel between the boosted supply and the pull-up-control node and a gate connected to a fifth node;

a first p-channel charge-pump diode transistor having a conducting channel between the boosted supply and a sixth node and a gate connected to the sixth node;

a second p-channel charge-pump transistor having a conducting channel between the sixth node and the fifth node and a gate connected to the fifth node; and second capacitor coupled between the fifth node and the second pulse node.

20. The high-side driver of claim 19 wherein the second stage comprises:

a p-channel complement series upper transistor having a gate receiving the first complement pulse node from the first stage, for conducting current from the supply to a first complement series node;

a p-channel complement series lower transistor having a gate receiving the second complement pulse node from the first stage, for conducting current from the first complement series node to a second complement series node;

a complement parallel n-channel transistor having a gate receiving the second complement series node, for conducting current from the second complement series node to the fourth node;

a complement cross-over parallel n-channel transistor having a gate receiving a second true series node, for conducting current from the second complement series node to the fourth node;

a p-channel true series upper transistor having a gate receiving the first pulse node from the first stage, for conducting current from the supply to a first true series node;

a p-channel true series lower transistor having a gate receiving the second pulse node from the first stage, for conducting current from the first true series node to a second true series node;

a true parallel n-channel transistor having a gate receiving the second true series node, for conducting current from the second true series node to the fourth node; and a true cross-over parallel n-channel transistor having a gate receiving the second complement series node, for conducting current from the second true series node to the fourth node.

* * * * *